(12) United States Patent
Kim et al.

(10) Patent No.: US 8,917,082 B2
(45) Date of Patent: Dec. 23, 2014

(54) POWER DETECTOR

(75) Inventors: Eun-Hee Kim, Daejeon (KR); Jin-Ho Ko, Daejeon (KR)

(73) Assignee: Intellectual Discovery Co., Ltd., Seoul (KR)

( * ) Notice: Subject to any disclaimer, the term of this patent is extended or adjusted under 35 U.S.C. 154(b) by 628 days.

(21) Appl. No.: 13/221,435

(22) Filed: Aug. 30, 2011

(65) Prior Publication Data

US 2012/0294055 A1  Nov. 22, 2012

(30) Foreign Application Priority Data

May 18, 2011 (KR) .................. 10-2011-0046615

(51) Int. Cl.
*G01R 19/22* (2006.01)
*H02M 7/217* (2006.01)
*H03F 3/45* (2006.01)
*H03G 3/30* (2006.01)

(52) U.S. Cl.
CPC .. *H03F 3/45179* (2013.01); *H03F 2203/45101* (2013.01); *H03F 2203/45306* (2013.01); *H03F 2203/45318* (2013.01); *H03G 3/3052* (2013.01)
USPC .......................................... 324/119; 363/127

(58) Field of Classification Search
CPC ........................ H03F 3/45179; H03G 3/3052
USPC .......... 363/125, 127; 324/119, 120; 327/104, 327/306, 343
See application file for complete search history.

(56) References Cited

U.S. PATENT DOCUMENTS

| | | | |
|---|---|---|---|
| 5,745,233 A * | 4/1998 | Asada et al. .................. 356/229 |
| 6,617,838 B1 * | 9/2003 | Miranda et al. ........... 324/117 R |
| 7,504,813 B2 * | 3/2009 | Manstretta .................... 323/312 |
| 7,560,959 B2 * | 7/2009 | Paraschou et al. .............. 327/72 |
| 7,622,874 B2 * | 11/2009 | Deng et al. ............... 318/400.22 |

OTHER PUBLICATIONS

An Isolator-less CMOS RF Front-End for UHF Mobile RFID Reader, Eun-Hee Kim et al., International Solid-State Circuits Conference, IEEE, 2011, 26 (2) pp. 466-458.

* cited by examiner

*Primary Examiner* — Matthew Nguyen
(74) *Attorney, Agent, or Firm* — NSIP Law

(57) ABSTRACT

A power detector having a differential input unit and a differential output unit. In one aspect, the invention may be a power detector including a differential input unit including a differential input terminal to which an AC signal is input and a DC voltage generator which generates and outputs a DC voltage; and a differential output unit including a differential output terminal which full wave rectifies the AC signal input from the differential input unit and outputs a differential signal, wherein a negative output terminal of the differential output terminal is connected to the output terminal of the DC voltage generator.

14 Claims, 8 Drawing Sheets

US 8,917,082 B2

POWER DETECTOR

CROSS-REFERENCE TO RELATED APPLICATIONS

This application claims priority under 35 U.S.C. §119 to Korean Patent Application No. 10-2011-0046615, filed on May 18, 2011, the entirety of which is hereby incorporated herein by reference.

FIELD OF THE INVENTION

The present invention relates to a power detector, and more particularly to a power detector comprising a differential input unit and a differential output unit.

BACKGROUND OF THE INVENTION

In CMOS process, a MOSFET is generally used as one of the components of an RF power detector. It requires a sufficiently wide bandwidth enough to support signal detection in an RF band, and therefore, a complex structure such as a received signal strength indication (RSSI) is difficult to be applied to the power detector. Even if possible, power consumption is increased.

FIGS. 1a and 1b are views for describing the attribute of a MOSFET used in a prior art power detector. More specifically, FIG. 1a shows a prior art NMOS RF power detector 10a which utilizes a voltage-current conversion characteristic of an active area of NMOS. FIG. 1b shows a prior art NMOS RF power detector 10b which utilizes a voltage-current conversion characteristic of a linear area of NMOS (see [1] Yijun Zhou et al., "A Low-Power Ultra-Wideband CMOS True RMS Power Detector," in IEEE Transactions on Microwave Theory and Techniques, Vol. 56, No. 5, May 2008, pp. 1052-1058; and [2] Kenneth A. Townsend, et al., "A Wideband Power Detection System Optimized for the UWB Spectrum," in IEEE JSSC., Vol. 44, No. 2, February 2009, pp. 371-381, the entireties of which are hereby incorporated herein by reference).

The output currents $i_{out}$ of the power detectors 10a and 10b shown in FIGS. 1a and 1b can be expressed in the following equation.

$$i_{out}(t) \propto \frac{k}{2} V_{in}^2 \qquad \text{equation (1)}$$

In FIGS. 1a and 1b, since $R_L$ is connected in parallel to $C_L$, R‖C load impedance shown in FIGS. 1a and 1b can be expressed by the formula $$Z_L = \frac{R_L}{1 + j\omega R_L C_L}.$$

Here, "ω" represents an angular frequency. The output voltage $V_{out}$ of the power detector is $i_{out} Z_L$ and can be expressed by $$V_{out} = \frac{k}{2} \frac{V_{in}^2 R_L}{1 + j\omega R_L C_L}.$$

Here, $1/(1+j\omega R_L C_L)$ represents a low pass filter of which the cut-off frequency is $1/R_L C_L$. When the $1/R_L C_L$ is sufficiently lower than the frequency of $V_{in}$, the $1/(1+j\omega R_L C_L)$ can function as a kind of an integrator.

"k" represents a process coefficient of the MOSFET, and therefore, has a large variation to process and temperature changes. Accordingly, the prior art power detector has a large process and large temperature change and is difficult to be applied to application products requiring accurate power detection.

SUMMARY OF THE INVENTION

An aspect of the present invention is a power detector. The power detector includes: a differential input unit including a differential input terminal to which an AC signal is input and a DC voltage generator which generates and outputs a DC voltage; and a differential output unit including a differential output terminal which full wave rectifies the AC signal input from the differential input unit and outputs a differential signal, wherein a negative output terminal of the differential output terminal is connected to the output terminal of the DC voltage generator.

A first capacitor may be connected to a positive input terminal of the differential input terminal. A second capacitor may be connected to a negative input terminal of the differential input terminal.

The DC voltage generator may include a current source and a first MOS transistor of which the source is connected to the current source and the negative output terminal and of which the gate and the drain are connected to each other and connected to the ground.

The DC voltage generator may include a first capacitor located between the current source and the ground and is connected to the current source and the ground, and a first amplifier of which the input terminal is connected to the source of the first MOS transistor and of which the output terminal is connected to the negative output terminal.

The differential output unit may include: a second MOS transistor of which the source is connected to a positive input terminal of the differential input terminal, of which the gate is connected to a negative input terminal of the differential input terminal and of which the drain is connected to a positive output terminal of the differential output terminal; and a third MOS transistor of which the source is connected to the negative input terminal and the gate of the second MOS transistor, of which the gate is connected to the positive input terminal and of which the drain is connected to the positive output terminal.

The second MOS transistor and the third MOS transistor complementarily function as an on/off switch in accordance with the polarity of the AC signal.

The differential output unit may include: a fourth capacitor is located between the gate of the second MOS transistor and the source of the third MOS transistor and is connected to the gate of the second MOS transistor and the source of the third MOS transistor; a fifth capacitor is located between the source of the second MOS transistor and the gate of the third MOS transistor and is connected to the source of the second MOS transistor and the gate of the third MOS transistor; a sixth capacitor is located between both the drain of the second MOS transistor and the drain of the third MOS transistor and the ground and is connected to both the drain of the second MOS transistor and the drain of the third MOS transistor and the ground; a second amplifier of which the input terminal is connected to the drain of the second MOS transistor and the drain of the third MOS transistor and of which the output terminal is connected to the positive output terminal; a first resistor which connects the negative output terminal with the source of the second MOS transistor, and a second resistor which connects the negative output terminal with the source of the third MOS transistor; and a third resistor which connects the gate of the second MOS transistor with the ground, and a fourth resistor which connects the gate of the third MOS transistor with the ground.

Another aspect of the present invention is a power detector. The power detector includes: a differential input unit including: a differential input terminal to which an AC signal is input; and a DC voltage generator which generates and outputs a DC voltage; and a differential output unit including: a differential output terminal which full wave rectifies the AC signal input from the differential input unit, and then outputs a differential signal; and a negative output signal generator which is connected to a positive output terminal of the differential output terminal and generates a compensation signal for linearity which is not maintained when the voltage of the positive output terminal is less than a critical voltage, and then provides the signal to a negative output terminal of the differential output terminal.

When the voltage of the positive output terminal is higher than the critical voltage, the negative output signal generator may output the same voltage as the output voltage of the DC voltage generator. When the voltage of the positive output terminal is less than the critical voltage, the negative output signal generator may output a voltage obtained by subtracting a voltage difference between the actual voltage and the ideal voltage of the positive output terminal from the output voltage of the DC voltage generator.

The negative output signal generator includes a current source, and a main current path and an auxiliary current path which allow a current from the current source to flow separately therethrough. When the positive output voltage is higher than the critical voltage, the current flows through only the main current path. When the positive output voltage is less than the critical voltage, the current flows through all of the main current path and the auxiliary current path. As the positive output voltage becomes less, the current flowing through the main current path is reduced.

The negative output signal generator further includes: a fourth MOS transistor of which the source is connected to the current source and of which the gate and the drain are connected to each other; a fifth MOS transistor of which the source is connected to the drain of the fourth MOS transistor and of which the gate and the drain are connected to each other and connected to the ground; and a sixth MOS transistor of the source is connected to the current source and of which the gale is connected to the positive output terminal and of which the drain is connected to the ground.

The fourth and the fifth MOS transistors form the main current path and the sixth MOS transistor forms the auxiliary current path.

The negative output signal generator further may include: a fifth resistor which is located between the current source and the sixth MOS transistor and is connected to the current source and the sixth MOS transistor; and a seventh capacitor which is located between the drain of the fourth MOS transistor and the ground and is connected to the drain of the fourth MOS transistor and the ground.

An output voltage $V_{TH}$ of the DC voltage generator, threshold voltages $V_{TH,M4}$ and $V_{TH,M6}$ of the fourth and the sixth MOS transistors and the critical voltage $V_A$ satisfy the following equations:

$$V_{TH}=V_{TH,5}$$

$$V_A-|V_{TH}|+|V_{TH,M4}|-|V_{TH,M6}|.$$

DETAILED DESCRIPTION

Hereafter, a power detector according to an exemplary embodiment of the present invention will be described in detail with reference to the accompanying drawings.

Figure 1A:
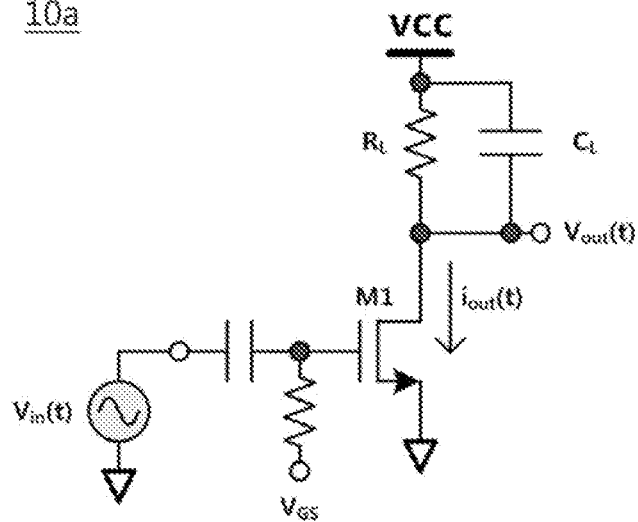
FIGS. 1a and 1b are circuit diagrams showing a configuration of a prior art power detector.
Figure 1B:
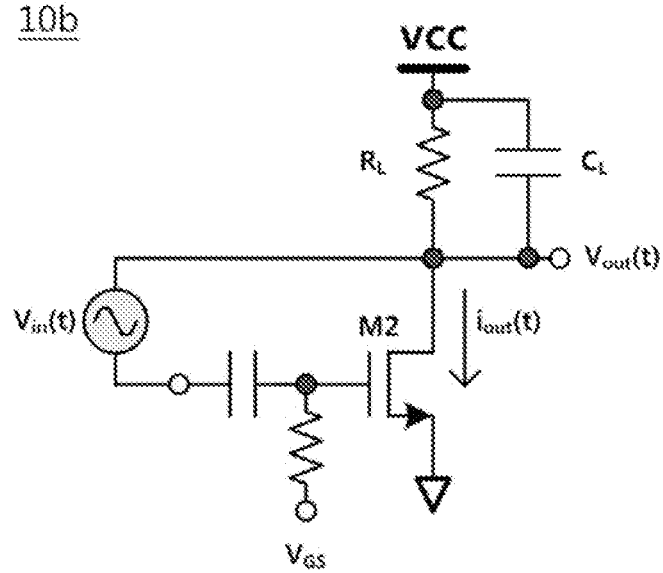
Figure 2:
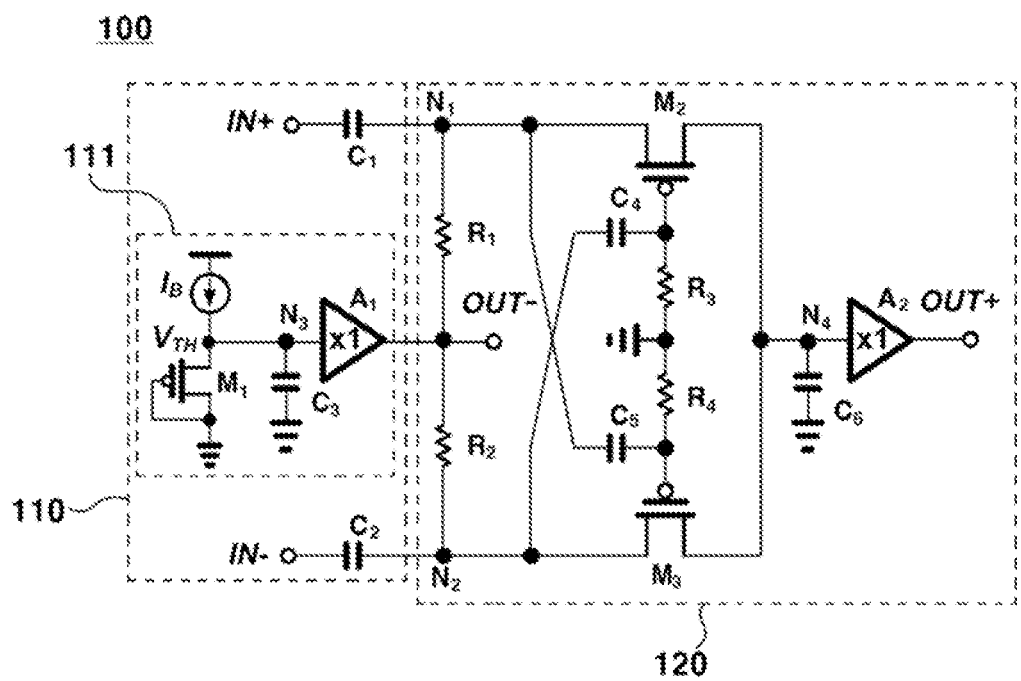
FIG. 2 is a circuit diagram showing a configuration of a power detector according to a first embodiment of the present invention.

FIG. 2 is a circuit diagram showing a configuration of a power detector 100 according to a first embodiment of the present invention. Referring to FIG. 2, the power detector 100 according to the first embodiment of the present invention includes a differential input unit 110 and a differential output unit 120.

The differential input unit 110 according to the first embodiment of the present invention includes a positive input terminal $V_{IN+}$, a negative input terminal $V_{IN-}$, a first and a second capacitors $C_1$ and $C_2$, and a DC voltage generator 111. The positive input terminal $V_{IN+}$ is connected to a first node $N_1$. The first capacitor $C_1$ is located between the positive input terminal $V_{IN+}$ and the first node $N_1$. The negative input terminal $V_{IN-}$ is connected to a second node $N_2$. The second capacitor $C_2$ is located between the negative input terminal $V_{IN+}$ and the second node $N_2$.

The DC voltage generator 111 generates a DC voltage to a negative output terminal $V_{OUT-}$, to be described below, of the differential output unit 120. The DC voltage generator 111 includes a current source $I_B$, a first MOS transistor $M_1$, a third capacitor $C_3$ and a first amplifier $A_1$. The current source $I_B$ supplies bias current to the first MOS transistor $M_1$. The source of the first MOS transistor $M_1$ is connected to a third node $N_3$. The gate and drain of the first MOS transistor $M_1$ are connected together to the ground. The third capacitor $C_3$ is located between the third node $N_3$ and the ground and is connected to the third node $N_3$ and the ground. The third capacitor $C_3$ uniformly maintains the voltage of the third node $N_3$. The input terminal of the first amplifier $A_1$ is connected to the third node $N_3$. The output terminal of the first amplifier $A_1$ is connected to the negative output terminal $V_{OUT-}$ of the differential output unit 120. The first amplifier $A_1$ is able to function as a voltage buffer having a voltage gain of 1.

According to the embodiment of the present invention, as the bias current supplied by the current source $I_B$ charges the third capacitor $C_3$, the voltage of the third node $N_3$ is uniformly maintained as the threshold voltage $V_{TH}$ of the first MOS transistor $M_1$. As a result, the voltage of the negative output terminal $V_{OUT-}$ of the differential output unit 120 can be uniformly maintained as the $V_{TH}$.

The differential output unit 120 according to the first embodiment of the present invention includes the negative output terminal $V_{OUT-}$ a positive output terminal $V_{OUT-}$, a second and a third MOS transistors $M_2$ and $M_3$, a fourth to a sixth capacitors $C_4$, $C_5$ and $C_6$, a second amplifier $A_2$ and a first to a fourth resistors $R_1$, $R_2$, $R_3$ and $R_4$. The negative output terminal $V_{OUT-}$ is, as described above, connected to the output terminal of the first amplifier $A_1$. The voltage of the negative output terminal $V_{OUT-}$ is uniformly maintained as the threshold voltage $V_{TH}$ of the MOS transistor included in the power detector 100. The negative output terminal $V_{OUT-}$ is connected to the first node $N_1$ and the second node $N_2$. The first resistor $R_1$ is located between the first node $N_1$ and the negative output terminal $V_{OUT-}$. The second resistor $R_2$ is located between the second node $N_2$ and the negative output terminal $V_{OUT-}$.

The gate of the second MOS transistor $M_2$ is connected to the second node $N_2$ and the ground. The fourth capacitor $C_4$ is located between the second MOS transistor $M_2$ and the second node $N_2$. The third resistor $R_3$ is located between the second MOS transistor $M_2$ and the ground. The source of the second MOS transistor $M_2$ is connected to the first node $N_1$. The drain of the second MOS transistor $M_2$ is connected to the fourth node $N_4$.

The gate of the third MOS transistor $M_3$ is connected to the first node $N_1$ and the ground. The fifth capacitor $C_5$ is located between the third MOS transistor $M_3$ and the first node $N_1$. The fourth resistor $R_4$ is located between the third MOS transistor $M_3$ and the ground. The source of the third MOS transistor $M_3$ is connected to the second node $N_2$. The drain of the third MOS transistor $M_3$ is connected to the fourth node $N_4$.

The input terminal of the second amplifier $A_2$ is connected to the fourth node $N_4$ and the ground. The sixth capacitor $C_6$ is located between the second amplifier $A_2$ and the ground. The output terminal of the second amplifier $A_2$ is connected to the positive output terminal $V_{OUT+}$. The second amplifier $A_2$ is able to function as a voltage buffer having a voltage gain of 1.

The first to the third MOS transistors $M_1$, $M_2$ and $M_3$ included in the power detector 100 of the present invention can be implemented by a PMOS transistor.

Figure 3:
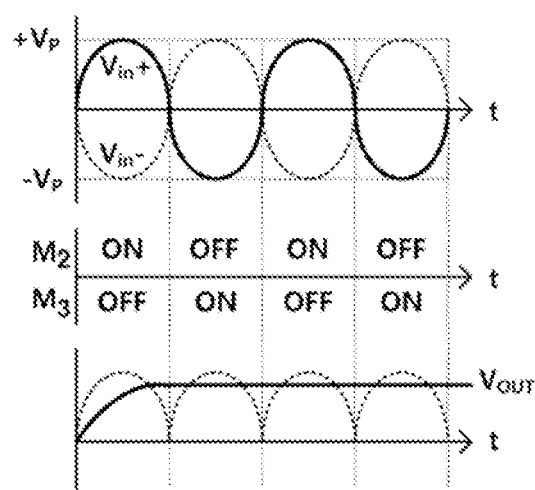
FIG. 3 shows the operation of a transistor included in the power detector according to the first embodiment of the present invention.

FIG. 3 shows the waveforms of an input signal and an output signal of the second and the third MOS transistors of $M_2$ and $M_3$, in the power detector 100 according to the first embodiment of the present invention. It is assumed that the input signal represented by $V_{in}=V_p \sin\theta(t)$ is used, which has the peak amplitude is $|V_p|$ and a certain period.

When an input signal is applied, the second MOS transistor $M_2$ and the third MOS transistor $M_3$ function as an on/off switch. More specifically, when the input signal ($V_{in}=V_p \sin\theta(t)$) has a positive value, the voltage of the positive input terminal $V_{IN+}$ causes the second MOS transistor $M_2$ to enter an ON-state and the third MOS transistor $M_3$ to enter an OFF-state. Contrarily, when the input signal ($V_{in}=V_p \sin\theta(t)$) has a negative value, the voltage of the negative input terminal $V_{IN-}$ causes the third MOS transistor $M_3$ to enter an ON-state and the second MOS transistor $M_2$ to enter an OFF-state. That is, the gate and the drain of the second MOS transistor $M_2$ are complementarily connected to the gate and the drain of the third MOS transistor $M_3$. Accordingly, when one enters an ON-state, the other enters an OFF-state.

Due to the complementary operation of the second MOS transistor $M_2$ and the third MOS transistor $M_3$, the input voltage in a positive period can be only transferred to the fourth node $N_4$ connected to the drains of the second MOS transistor $M_2$ and the third MOS transistor $M_3$. The signal of the fourth node $N_4$ is transferred to the positive output terminal $V_{OUT+}$ through the second amplifier $A_2$. Accordingly, FIG. 3 shows that the output of the positive output terminal $V_{OUT+}$ has full-wave rectifying characteristics. In other words, the second MOS transistor $M_2$ and the third MOS transistor $M_3$ can perform a function of full wave rectification by complementarily repeating ON/OFF states.

Meanwhile, the gate bias voltages of the second MOS transistor $M_2$ and the third MOS transistor $M_3$ are connected to the ground through the third and the fourth resistors $R_3$ and $R_4$ respectively. The source voltage of the second MOS transistor $M_2$ and the third MOS transistor $M_3$ are fixed at the threshold voltage generated by the DC voltage generator 111 through the resistors $R_1$ and $R_2$. Then, the bias voltage difference between the gate-source of the second MOS transistor $M_2$ and the third MOS transistor $M_3$ becomes always $-V_{TH}$, and therefore, even when the input signal has a small amplitude, the second MOS transistor $M_2$ and the third MOS transistor $M_3$, as described above with reference to FIG. 3, enter an ON-state or an OFF-state, depending on the sign of an input AC signal.

Figure 4A:
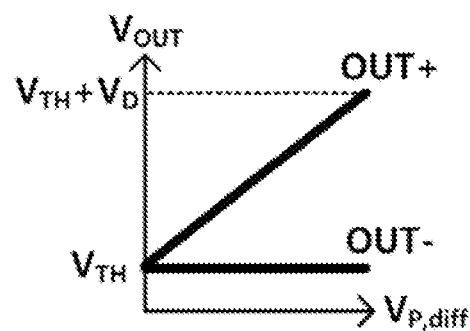
FIGS. 4a and 4b are graphs showing a relation between the amplitude of a differential input signal and a differential output signal in the power detector according to the first embodiment of the present invention.
Figure 4B:
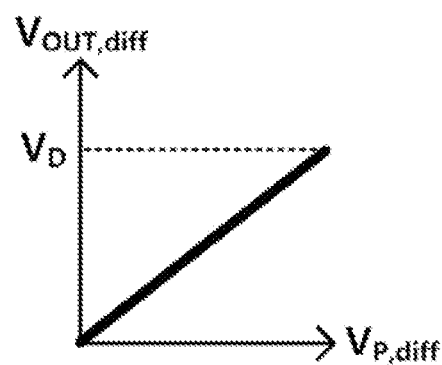

FIGS. 4a and 4b are graphs showing a relation between the amplitude of a differential input signal $V_{P,diff}$ and the amplitude of a differential output signal $V_{OUT,diff}$ in the power detector 100 according to the first embodiment of the present invention. FIG. 4a shows the signal amplitude of the negative output terminal $V_{OUT-}$ and the signal amplitude of the positive output terminal $V_{OUT+}$. FIG. 4b shows the resulting differential output signal $V_{OUT,diff}$.

Referring to FIG. 4a, since the DC bias voltage of the positive output terminal $V_{OUT+}$ equals to the voltage of the negative output terminal $V_{OUT-}$, as described above, the differential output signal $V_{OUT,diff}$ has linear relation to differential input voltage $V_{P,diff}$.

Referring to FIG. 4b, a maximum value $V_D$ of the differential output signal $V_{OUT,diff}$, i.e., a difference value $V_D$ between the voltage of the positive output terminal $V_{OUT+}$ and the voltage of the negative output terminal $V_{OUT-}$ can be expressed in the following equation (2).

$$V_D = \frac{1}{\pi} \cdot \int_0^\pi V_P \sin\theta d\theta = \frac{2 \cdot V_P}{\pi} \qquad \text{equation (2)}$$

Referring to the equation (2), it can be shown that the frequency conversion gain of the power detector 100 according to the first embodiment of the present invention corresponds to the slope of the graph showing a relation between the differential input signal and the differential output signal, that is, corresponds to $2/\pi$.

The larger amplitude of the input AC signal allows the second MOS transistor $M_2$ and the third MOS transistor $M_3$ to function as an ideal switch. On the contrary, when the amplitude of the input AC signal becomes small, they cannot function as an ideal switch.

Figure 5A:
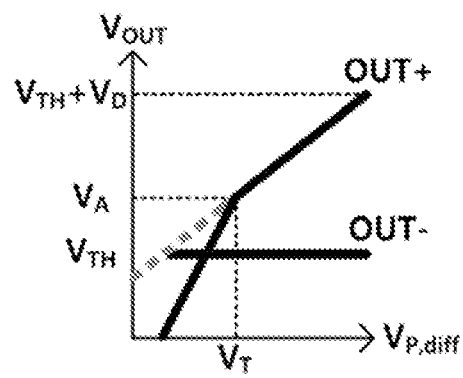
FIGS. 5a and 5b are graphs showing in detail a relation between the amplitude of the differential input signal and the differential output signal in the power detector according to the first embodiment of the present invention.
Figure 5B:
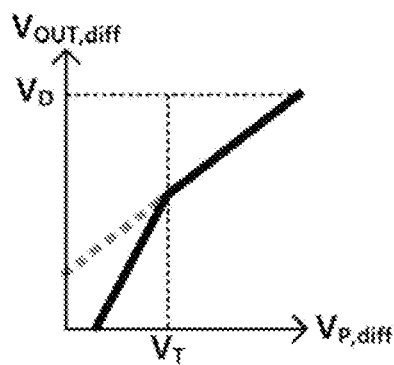

FIGS. 5a and 5b are graphs showing a relation between the amplitude of the differential input signal $V_{P,diff}$ and the differential output signal $V_{OUT,diff}$ in the power detector 100 according to the first embodiment of the present invention, considering a case where the amplitude of the input signal $V_{P,diff}$ is equal to or smaller than a critical voltage $V_T$ incapable of allowing the second MOS transistor $M_2$ and the third MOS transistor $M_3$ to stably maintain an ON-state. FIG. 5a shows positive and negative output signals of $V_{OUT+}$ and $V_{OUT-}$, and FIG. 5b shows the differential output voltage of $V_{OUT,diff}$.

As described above, the frequency conversion gain of the power detector 100 theoretically corresponds to the slope of the graph showing a relation between the differential input signal and the differential output signal, that is, corresponds to $2/\pi$. However, referring to FIG. 5b, when the amplitude of the differential input signal $V_{P,diff}$ is smaller than the critical value $V_T$, the frequency conversion gain cannot be maintained as a constant value. In other words, the slope of the graph representing a relation between differential input and output signals changes, and this means that linearity of the overall power detector is distorted. This is because the second MOS transistor $M_2$ and the third MOS transistor $M_3$ cannot stably maintain an ON-state when the amplitude of the differential input signal $V_{P,diff}$ is small.

Figure 5C:
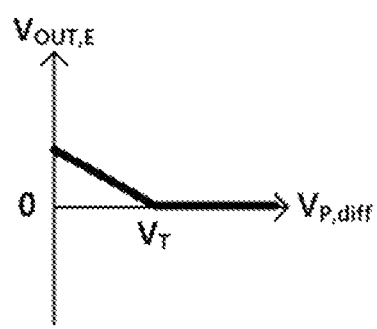
FIG. 5c is a graph showing an error value of the differential output signal based on the amplitude of an input signal in the power detector according to the first embodiment of the present invention.

FIG. 5c is a graph showing an error value $V_{OUT,E}$ of the differential output signal with respect to the amplitude of the input signal $V_{P,diff}$. Referring to FIG. 5c, it can be noted that when the amplitude of the input signal $V_{P,diff}$ is equal to or smaller than the critical voltage $V_T$ incapable of allowing the second MOS transistor $M_2$ and the third MOS transistor $M_3$ to stably enter an ON-state, an error signal is generated. It can be represented by $V_{OUT,E}$, which is a voltage difference between a desired amplitude of the differential output signal $V_{OUT,diff}$ on the assumption that the linearity is maintained regardless of the amplitude of the input signal $V_{P,diff}$ and an actual amplitude of the differential output signal $V_{OUT,diff}$ in which the linearity is not maintained.

As such, when the amplitude of the input signal $V_{P,diff}$ is small, the linearity of the power detector 100 may not be maintained. A power detector according to a second embodiment of the present invention which overcomes such a problem will be described below.

Figure 6:
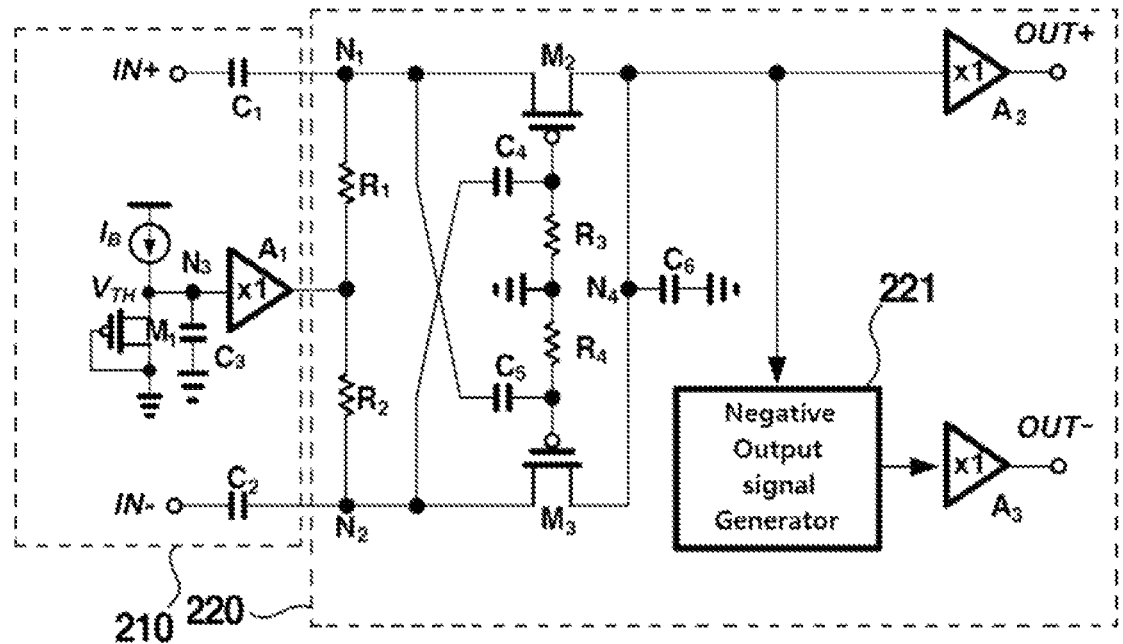
FIG. 6 is a circuit diagram showing a configuration of a power detector according to a second embodiment of the present invention.

FIG. 6 is a circuit diagram showing a configuration of a power detector 200 according to a second embodiment of the present invention. Referring to FIG. 6, the power detector 200 according to the second embodiment of the present invention also includes a differential input unit 210 and a differential output unit 220.

The differential input unit 210 according to the second embodiment of the present invention includes a positive input terminal $V_{IN+}$, a negative input terminal $V_{IN-}$, a first to a third capacitors $C_1$, $C_2$ and $C_3$, a current source $I_B$, a first MOS transistor $M_1$ and a first amplifier $A_1$.

The overall configuration of the differential input unit 210 according to the second embodiment of the present invention is the same as that of the differential input unit 110 according to the first embodiment. Therefore, detailed description thereof will be omitted. However, it should be noted that the differential input unit 210 is different from the differential input unit 110 of the first embodiment in that the output terminal of the first amplifier $A_1$ does not function as a negative output terminal $V_{OUT-}$ of the power detector 200.

The differential output unit 220 according to the second embodiment of the present invention includes a negative output terminal $_{OUT-}$, a positive output terminal $V_{OUT+}$, a second and a third MOS transistors $M_2$ and $M_3$, a fourth to a sixth capacitors $C_4$, $C_5$ and $C_6$, a second amplifier $A_2$ and a first to a fourth resistors $R_1$, $R_2$, $R_3$ and $R_4$. The differential output unit 220 according to the second embodiment of the present invention is different from the differential output unit 120 according to the first embodiment in that the differential output unit 220 includes a negative output signal generator 221.

The negative output signal generator 221 uses a fourth node $N_4$ as an input terminal. The fourth node $N_4$ is connected to the drains of the second and the third MOS transistors $M_2$ and $M_3$, one end of the sixth capacitor $C_6$ and the input terminal of the second amplifier $A_2$. The output terminal of the negative output signal generator 221 is connected to the input terminal of a third amplifier $A_3$. The output terminal of the third amplifier $A_3$ is connected to the negative output terminal $_{OUT-}$. The third amplifier $A_3$ can also function as a voltage buffer having a voltage gain of 1, identically to the first and the second amplifiers $A_1$ and $A_2$.

The negative output signal generator 221 generates, as described above, an appropriate voltage of the positive output terminal $V_{OUT+}$, even in the signal range in which the linearity of the power detector is not guaranteed, thereby allowing a differential output signal to maintain the linearity without regard to the amplitude of the input signal.

Figure 7:
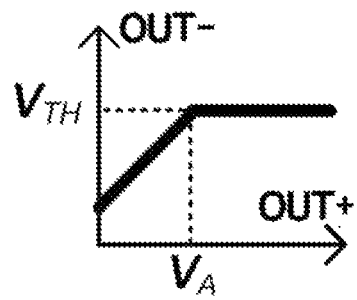
FIG. 7 is a graph for describing the operation of a negative output signal generator of the power detector according to the second embodiment of the present invention.

FIG. 7 is a graph for describing the operation of the negative output signal generator 221. Referring to FIG. 7, when the amplitude of a positive output signal OUT+ is larger than a critical voltage $V_A$, the negative output signal generator 221 always outputs the threshold voltage $V_{TH}$ of the MOS transistor regardless of the amplitude of the differential input signal $V_{P,diff}$. Accordingly, when the amplitude of the positive output signal OUT+ is larger than the critical voltage $V_A$, a negative output signal OUT− is always maintained as the threshold voltage $V_{TH}$. Also, when the amplitude of a positive output signal OUT+ is less than the critical voltage $V_A$, the negative output signal generator 221 outputs a difference value $V_{TH}-V_{OUT,E}$ between the threshold voltage $V_{TH}$ and the error value $V_{OUT,E}$ shown in FIG. 5c. Therefore, the amplitude of the differential output signal $V_{D,diff}$ in a signal range in which the amplitude of the positive output signal OUT+ is less than the critical voltage $V_A$ is expressed in the following equation (3).

$$V_{D,diff} = \{OUT+\} - \{OUT-\} = \{OUT+\} - \{V_{TH} - V_{OUT,E}\} - \{OUT-\} - \{V_{TH}\} + \{V_{OUT,E}\} \qquad \text{equation (3)}$$

Referring to the equation (3), the error value $V_{OUT,E}$ is compensated in the signal range in which the amplitude of the positive output signal OUT+ is less than the critical voltage $V_A$. Therefore, an effect is obtained, in which linear operation of the second embodiment of the present invention is accomplished without regard to the amplitude of input signal.

Figure 8A:
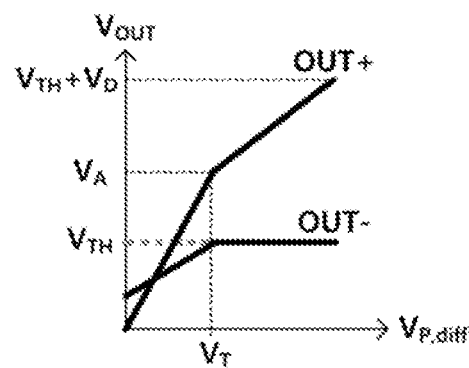
FIGS. 8a and 8b are graphs showing a relation between the amplitude of a differential input signal and a differential output signal in the power detector according to the second embodiment of the present invention.
Figure 8B:
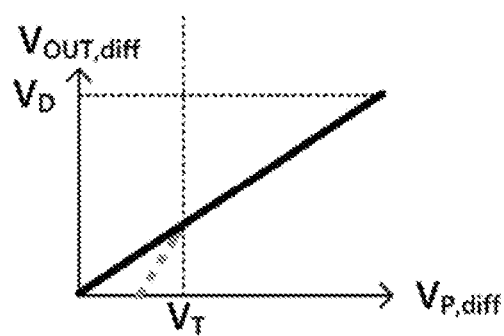

FIGS. 8a and 8b are graphs showing a relation between the amplitude of the differential input signal $V_{P,diff}$ and the amplitude of a differential output signal $V_{OUT,diff}$ in the power detector 200 according to the second embodiment of the present invention. FIG. 8a shows the signal amplitude of the negative output terminal $V_{OUT-}$ and the signal amplitude of the positive output terminal $V_{OUT+}$. FIG. 5b shows the resulting differential output signal $V_{OUT,diff}$.

Referring to FIG. 8a, when the amplitude of the differential input signal equals to a critical voltage $V_T$, the positive output signal OUT+ has a critical voltage $V_A$ the linearity cannot be maintained under the voltage. As described above, when the amplitude of a positive output signal OUT+ is larger than the critical voltage $V_A$, in other words, when the amplitude of the differential input signal $V_{P,diff}$ is larger than the critical voltage $V_T$, the negative output signal OUT− has the same as the threshold voltage $V_{TH}$. Meanwhile, when the amplitude of a positive output signal OUT+ is less than the critical voltage $V_A$, in other words, when the amplitude of the differential input signal $V_{P,diff}$ is less than the critical voltage $V_T$, the negative output signal OUT− has a difference value between the threshold voltage $V_{TH}$ and the error value $V_{OUT,E}$. When the amplitude of a positive output signal OUT+ is reduced below the critical voltage $V_A$ due to non-ideal SW operation, the negative output signal OUT− compensates for the signal range in which the linearity is not maintained.

Referring to FIG. 8b, it can be seen that the differential output signal $V_{OUT,diff}$ of the power detector 200 maintains linear relation to any input signal level of the differential input voltage $V_{P,diff}$. Accordingly, the frequency conversion gain can be also uniformly maintained.

Figure 9:
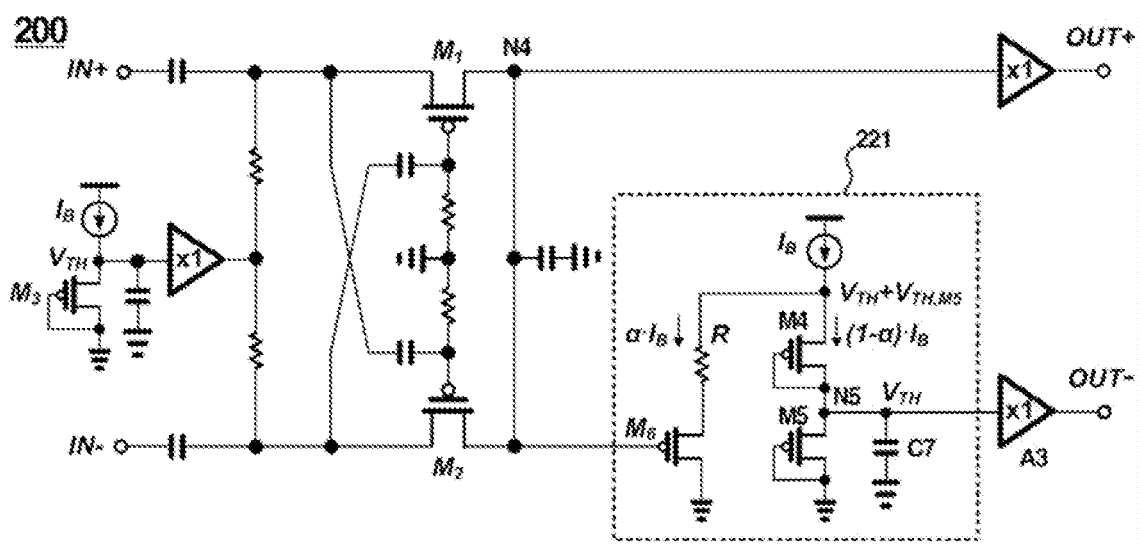
FIG. 9 is a circuit diagram showing in detail a configuration of the power detector according to the second embodiment of the present invention.

FIG. 9 is a circuit example showing in detail an internal configuration of the negative output signal generator 221 in the power detector 200 according to the second embodiment of the present invention. Referring to FIG. 9, the negative output signal generator 221 includes the current source $I_B$, a fourth to a sixth MOS transistors $M_4$, $M_5$ and $M_6$, a fifth resistor $R_5$ and a seventh capacitor $C_7$.

The source of the fourth MOS transistor $M_4$ is connected to the current source $I_B$. That is, the current from the current source $I_B$ is supplied to the source of the fourth MOS transistor $M_4$. The gate and the drain of the source of the fourth MOS transistor $M_4$ are connected to each other and are connected to the fifth node $N_5$.

The source of the fifth MOS transistor $M_5$ is connected to the fifth node $N_5$. The gate and the drain of the source of the fifth MOS transistor $M_5$ are connected to each other and are connected to the ground.

The source of the sixth MOS transistor $M_6$ is connected to the source of the fourth MOS transistor $M_4$. The fifth resistor $R_5$ is located between the sixth MOS transistor $M_6$, and the fourth MOS transistor $M_4$. The gate of the sixth MOS transistor $M_6$ is connected to the fourth node $N_4$. The drain of the sixth MOS transistor $M_6$ is connected to the ground.

The input terminal of the third amplifier $A_3$ is connected to the fifth node $N_5$. The output terminal of the third amplifier $A_3$ is connected to the negative output terminal $V_{OUT-}$. The fifth node $N_5$ is connected to the ground. The seventh capacitor $C_7$ is located between the fifth node $N_5$ and the ground. The fourth to the sixth MOS transistors $M_4$, $M_5$ and $M_6$ can be implemented by a PMOS transistor.

Meanwhile, the size of the fifth MOS transistor $M_5$ can be determined in such a manner that the threshold voltage $V_{TH,M5}$ of the fifth MOS transistor $M_5$ is the same as the threshold voltage $V_{TH,M1}=V_{TH}$ of the first MOS transistor $M_1$. What's more, the size of the fourth and the sixth MOS transistors $M_4$ and $M_6$ should be determined on condition that the threshold voltages $V_{TH,M4}$ and $V_{TH,M6}$ of the fourth and the sixth MOS transistors $M_4$ and $M_6$ and a critical voltage. $V_A$ satisfy the following equation (4).

$$V_A = |V_{TH}| + |V_{TH,M4}| - |V_{TH,M6}| \qquad \text{equation (4)}$$

Referring to FIG. 9 again, the operation of the negative output signal generator 221 will be described. The current from the current source $I_B$ flows separately through an auxiliary current path including the sixth MOS transistor $M_6$ and through a main current path including the fourth and the fifth MOS transistors $M_4$ and $M_5$. When the current flowing through the auxiliary current path, that is, in the direction of the source of the sixth MOS transistor $M_6$ is designated as $\alpha \cdot I_B$, the current flowing through the main current path, that is, in the direction of the source of the fourth MOS transistor $M_4$ is designated as $(1-\alpha) \cdot I_B$. Since a relation of $V_{TH,M5}=V_{TH}$ is established, $(V_{TH}+V_{TH,M4})$ is assigned to the source voltage of the fourth MOS transistor $M_4$.

When the amplitude of the positive output signal OUT+ is larger than a critical voltage of $V_A-|V_{TH}|+|V_{TH,M4}|-|V_{TH,M6}|$, the sixth MOS transistor $M_6$ enters an OFF-state, so that $\alpha=0$. The current from the current source $I_B$ hereby flows through all of the fourth and the firth MOS transistors $M_4$ and $M_5$. Accordingly, the voltage of the fifth node $N_5$ is maintained as $V_{TH}$ and the amplitude of the negative output signal OUT− is $V_{TH}$.

Meanwhile, the amplitude of the positive output signal OUT+ is less than a critical voltage of $V_A=|V_{TH}|+|V_{TH,M4}|-|V_{TH,M6}|$ (i.e., OUT+$\leq|V_{TH}|+|V_{TH,M4}|-|V_{TH,M6}|$), so that $\alpha \neq 0$. Therefore, the current of $\alpha \cdot I_B$ flows through the auxiliary current path. Here, as the amplitude of the positive output signal OUT+ becomes less, a voltage between the source and the gate of the sixth MOS transistor $M_6$ is increased. Therefore, the current of $\alpha \cdot I_B$ flowing through the auxiliary current path is increased. As the current of $\alpha \cdot I_B$ flowing through the auxiliary current path is increased, a voltage drop by the fifth resistor $R_5$ is also increased. Accordingly, a voltage between the source and the gate of the sixth MOS transistor $M_6$ is more increased. That is, as the amplitude of the positive output signal OUT+ becomes less, a increases and the magnitude of the current of $(1-\alpha) \cdot I_B$ flowing through the main current path is reduced. Accordingly, in a signal range less than the critical voltage $V_A$, as the amplitude of the positive output signal OUT+ is reduced, the amplitude of the negative output signal OUT− is also reduced, so that the error compensation of the differential output signal voltage $V_{OUT,diff}$ is performed.

As described above, it will be appreciated by those skilled in the art that the present invention can be embodied in other specific forms without departing from its spirit or essential characteristics.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A power detector, comprising:
    a differential input unit comprising
        a differential input terminal configured to receive an AC signal and
        a DC voltage generator configured to generate and output a DC voltage; and
    a differential output unit comprising differential output terminal configured to full wave rectify the AC signal input from the differential input unit and output a differential signal, wherein a negative output terminal of the differential output terminal is connected to the output terminal of the DC voltage generator.

2. The power detector of claim 1, wherein a first capacitor is connected to a positive input terminal of the differential input terminal, and wherein a second capacitor is connected to a negative input terminal of the differential input terminal.

3. The power detector of claim 1, wherein the DC voltage generator comprises:
a current source; and
a first MOS transistor of which the source is connected to the current source and the negative output terminal and of which the gate and the drain are connected to each other and connected to the ground.

4. The power detector of claim 3, wherein the DC voltage generator comprises:
a third capacitor located between the current source and the ground and connected to the current source and the ground; and
a first amplifier of which the input terminal is connected to the source of the first MOS transistor and of which the output terminal is connected to the negative output terminal.

5. The power detector of claim 1, wherein the differential output unit comprises: a second MOS transistor of which the source is connected to a positive input terminal of the differential input terminal, of which the gate is connected to a negative input terminal of the differential input terminal and of which the drain is connected to a positive output terminal of the differential output terminal;
a third MOS transistor of which the source is connected to the negative input terminal and the gate of the second MOS transistor, of which the gate is connected to the positive input terminal and of which the drain is connected to the positive output terminal; and
wherein the second MOS transistor and the third MOS transistor complementarily operation as an on/off switch in accordance with the polarity of the AC signal.

6. The power detector of claim 5, wherein the differential output unit comprises:
a fourth capacitor located between the gate of the second MOS transistor and the source of the third MOS transistor and connected to the gate of the second MOS transistor and the source of the third MOS transistor;
a fifth capacitor located between the source of the second MOS transistor and the gate of the third MOS transistor and connected to the source of the second MOS transistor and the gate of the third MOS transistor;
a sixth capacitor located between both the drain of the second MOS transistor and the drain of the third MOS transistor and the ground and connected to both the drain of the second MOS transistor and the drain of the third MOS transistor and the ground;
a second amplifier of which the input terminal is connected to the drain of the second MOS transistor and the drain of the third MOS transistor and of which the output terminal is connected to the positive output terminal;
a first resistor which connects the negative output terminal with the source of the second MOS transistor, and a second resistor which connects the negative output terminal with the source of the third MOS transistor; and
a third resistor which connects the gate of the second MOS transistor with the ground, and a fourth resistor which connects the gate of the third MOS transistor with the ground.

7. A power detector, comprising:
a differential input unit comprising
a differential input terminal configured to receive an AC signal; and
a DC voltage generator configured to generate and output a DC voltage; and
a differential output unit comprising
a differential output terminal configured to full wave rectify the AC signal input and output a differential signal; and
a negative output signal generator connected to a positive output terminal of the differential output terminal and configured to generate a compensation signal for linearity, which is not maintained when the voltage of the positive output terminal is less than a critical voltage, and provide the signal to a negative output terminal of the differential output terminal.

8. The power detector of claim 7 further comprising: wherein when the voltage of the positive output terminal is higher than the critical voltage, the negative output signal generator outputs the same voltage as the output voltage of the DC voltage generator; and wherein when the voltage of the positive output terminal is less than the critical voltage, the negative output signal generator outputs a voltage obtained by subtracting a voltage difference between the actual voltage and the ideal voltage of the positive output terminal from the output voltage of the DC voltage generator.

9. The power detector of claim 8, wherein the negative output signal generator comprises: a current source; and a main current path and an auxiliary current path which allow a current from the current source to flow separately therethrough;
wherein when the voltage of the positive output terminal is higher than the critical voltage, the current flows through only the main current path; and
wherein when the voltage of the positive output terminal is less than the critical voltage, the current flows through all of the main current path and the auxiliary current path, and wherein, as the voltage of the positive output terminal becomes less, the current flowing through the main current path is reduced.

10. The power detector of claim 9, wherein the negative output signal generator further comprises:
a fourth MOS transistor of which the source is connected to the current source and of which the gate and the drain are connected to each other;
a fifth MOS transistor of which the source is connected to the drain of the fourth MOS transistor and of which the gate and the drain are connected to each other and connected to the ground; and
a sixth MOS transistor of the source is connected to the current source and of which the gate is connected to the positive output terminal and of which the drain is connected to the ground, wherein the fourth and the fifth MOS transistors form the main current path and the sixth MOS transistor forms the auxiliary current path.

11. The power detector of claim 10, wherein the negative output signal generator further comprises:
a fifth resistor which is located between the current source and the sixth MOS transistor and is connected to the current source and the sixth MOS transistor; and
a seventh capacitor which is located between the drain of the fourth MOS transistor and the ground and is connected to the drain of the fourth MOS transistor and the ground.

12. The power detector of claim 10, wherein an output voltage $V_{TH}$ of the DC voltage generator, threshold voltages $V_{TH,M4}$, $V_{TH,M5}$, and $V_{TH,M6}$ of the fourth, the fifth, and the sixth MOS transistors, and the critical voltage $V_A$ satisfy the following equations:

$$V_{TH}=V_{TH,M5} \text{ and } V_A=|V_{TH}|+|V_{TH,M4}|-|V_{TH,M6}|.$$

13. The power detector of claim 3, wherein the voltage of the negative output terminal is uniformly maintained as a threshold voltage $V_{TH,M1}$ of the first MOS transistor in the power detector.

14. The power detector of claim 5, wherein a source voltage of the second MOS transistor and the third MOS transistor are fixed at a threshold voltage generated by the DC voltage generator.

* * * * *